US012658896B2

(12) United States Patent
Hsu et al.

(10) Patent No.: US 12,658,896 B2
(45) Date of Patent: Jun. 16, 2026

(54) INTEGRATED CLOCK GATE WITH CIRCUITRY TO FACILITATE CLOCK FREQUENCY DIVISION

(71) Applicant: Intel Corporation, Santa Clara, CA (US)

(72) Inventors: Steven Hsu, Lake Oswego, OR (US); Amit Agarwal, Hillsboro, OR (US); Simeon Realov, Portland, OR (US); Mark Anders, Hillsboro, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 17/856,887

(22) Filed: Jul. 1, 2022

(65) Prior Publication Data

US 2024/0007087 A1     Jan. 4, 2024

(51) Int. Cl.
*H03K 3/037* (2006.01)
*G06F 1/06* (2006.01)
*H03K 19/21* (2006.01)

(52) U.S. Cl.
CPC .............. *H03K 3/037* (2013.01); *G06F 1/06* (2013.01); *H03K 19/21* (2013.01)

(58) Field of Classification Search
CPC .... H03K 19/0016; H03K 19/20; H03K 3/037; H03K 19/0013; H03K 19/0944; H03K 3/012; H03K 3/0372; H03K 3/356121; H03K 3/356156; H03K 3/35625; H03K 3/017; H03K 3/02332; H03K 3/289;

H03K 3/356104; H03K 3/3562; H03K 19/1733; H03K 19/21; H03K 3/0375; H03K 3/35606; H03K 3/356182; H03K 19/00315; G01R 31/3177; G01R 31/318541; G01R 31/318525; G01R 31/318533; G01R 31/318552; G01R 31/318566; G01R 31/318594; G01R 31/3016;

(Continued)

(56) References Cited

U.S. PATENT DOCUMENTS 8,058,900 B1 * 11/2011 Rosen ........................ G06F 1/06
                                                327/158
9,048,843 B1 * 6/2015 Nordyke ................... G06F 1/06
(Continued)

*Primary Examiner* — Lincoln D Donovan
*Assistant Examiner* — James G Yeaman
(74) *Attorney, Agent, or Firm* — NICHOLSON DE VOS WEBSTER & ELLIOTT LLP

(57) ABSTRACT

Techniques and mechanisms for an integrated clock gate (ICG) to selectively output a clock signal, and to provide frequency division functionality. In an embodiment, an ICG circuit comprises first circuitry which is coupled to receive a first clock signal, and second circuitry which is coupled to receive a control signal. The first circuitry provides a single edge triggered flip-flop functionality, and is coupled to communicate a feedback signal which the first circuitry is further coupled to receive. Based on the control signal and the feedback signal, the second circuitry performs an exclusive OR (XOR) operation to selectively enable the first circuitry to generate a second clock signal based on the first clock signal. In another embodiment, a frequency of the second clock signal is substantially equal to one half of a frequency of the first clock signal.

20 Claims, 7 Drawing Sheets

(58) Field of Classification Search
CPC ...... G01R 31/31725; G01R 31/318572; G01R
31/2851; G06F 1/06; G06F 1/08; G06F
1/10; G06F 1/32; G06F 1/3237; G06F
3/0604; G06F 3/0659; G06F 3/0673;
G06F 30/30; Y02D 10/00; G11C 11/4074;
G11C 11/4076; G11C 11/4085; G11C
11/4087; G11C 11/4093; G11C 7/106;
G11C 7/222; G11C 19/28; G11C 19/34;
G09G 2300/0857; G09G 2310/0267;
G09G 2310/08; G09G 2330/021; G09G
3/2096; G09G 2310/0286; G09G 3/3266;
G09G 3/3674
See application file for complete search history.

(56) References Cited

U.S. PATENT DOCUMENTS

| | | | |
|---|---|---|---|
| 10,177,765 B2 | 1/2019 | Hsu et al. | |
| 10,461,747 B2 * | 10/2019 | Venugopal | ......... H03K 19/0016 |
| 10,491,217 B2 | 11/2019 | Hsu et al. | |
| 2019/0044511 A1 * | 2/2019 | Hsu | ......................... G06F 30/30 |
| 2021/0194468 A1 * | 6/2021 | Agarwal | ........ G01R 31/318536 |
| 2021/0281250 A1 | 9/2021 | Hsu et al. | |
| 2022/0026945 A1 | 1/2022 | Shamanna et al. | |

* cited by examiner

100

151

600

1x clock
602       610       614

604                 612

1x clock
616

622

1x clock
620

1x clock
624

626
SET FFs (1/2)x
clock
634

636
DET FFs 632          630

1x clock
644

646
SET FFs

640

642

652

(1/2)x
clock
654

656
DET FFs

650

INTEGRATED CLOCK GATE WITH CIRCUITRY TO FACILITATE CLOCK FREQUENCY DIVISION

BACKGROUND

1. Technical Field

This disclosure generally relates to circuit clocking and more particularly, but not exclusively, to gating circuitry which controls the communication of a clock signal.

2. Background Art

Area-efficient designs for modern microprocessors, DSP's (Digital Signal Processors), SoC's (System-on-Chip) in wearables, IoTs (Internet-of-Things), smartphones, tablets, laptops, and servers, etc., are increasingly becoming a critical factor due to the following requirements: reducing silicon cost, decreasing PCB (Printed Circuit Board) footprint, improving time-to-market (TTM), and slower scaling cadence of process technology node. These requirements all need to be met while meeting the stringent frequency and/or performance targets and power/leakage budgets.

A major component of the power dissipation in digital systems is due to charging and discharging load capacitance of circuit nodes, otherwise known as dynamic power. In today's clocked synchronous systems—microprocessors, DSP's, and SoC's in smartphones, tablets, laptops, and servers—a large percentage of the overall power dissipation is in the clock grid and the sequential load.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and mechanisms for an integrated clock gate (ICG) to facilitate the operation of multi-bit flip-flops (FFs) at different respective frequencies. Clocking is one of the most significant power contributors and limiters for power-constrained server and/or mobile microprocessors and SoCs (system-on-chips), discrete and/or integrated graphics, AI (artificial intelligence) and/or special-purpose accelerators. Reducing power in systems with tight budgets improves performance by allowing integrating more cores, memory, or processing elements, and improves battery life for mobile and edge devices. Dynamic clocking power is the largest contributor and consumes up to, for example, 60% of the overall chip power dissipation, where most of the load is in the final flip-flops.

A flip-flop (FF) is a fundamental circuit used in all digital synchronous systems and must be very low power, since it contributes the most to the clocking power. Today's FFs already utilize minimum sized devices, and cannot be further downsized to reduce power. With process technology scaling, circuits are limited by variations to enable low-voltage operation for high energy-efficiency. This limits the smallest allowable device size preventing any further dynamic power savings though transistor sizing. Since performance, power, and area (PPA) benefits are slowing down as process technology scales (e.g., below the 7 nm process technology node), there is a need for new circuit innovations to improve PPA, specifically to reduce clocking power. In addition, with strong demand for higher frequency CPUs (central processing units), graphics, and artificial intelligence (AI) accelerators, deeper pipelines will exacerbate clocking power, increasing clock power further.

Multi-bit flip-flops are a common used technology to reduce FF clocking power and have been integrated into many synthesis and automatic place and route (APR) tool flows. The concept involves grouping flip-flops in close physical proximity and combining them into a single standard cell with shared and down-sized local clock inverters. This contributes to a reduction in the local clock inverter power contribution and clock pin-cap.

Conventional designs use single-edge-triggered (SET) flip-flops in sequential circuitry, where data is only triggered (for example) off of the rising edge of the clock. One way to mitigate clock power consumption is to use sequential circuitry which instead comprises double-edge-triggered (DET) flip-flops that are able to store data at both rising edges and at falling edges of a clock signal. DET flip-flops enable the use of a lower frequency clock, which is associated with relatively low power consumption.

Figure 1A:
FIG. 1A shows a circuit diagram illustrating features of a circuit to control the provisioning of a clock signal according to an embodiment.
Figure 1A:
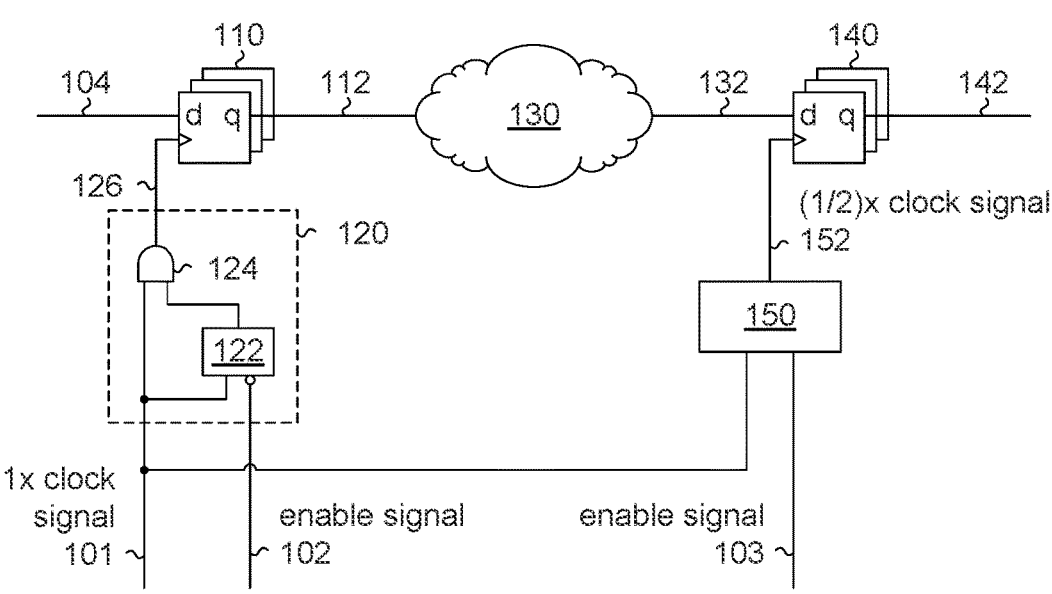

Some embodiments variously provide a clock gating circuit, which provides integrated logic gate circuitry and a feedback path, that facilitates use in a mixed frequency clocking scheme—e.g., to enable an incorporation of dual-edge triggered (DET) flip-flops (FFs) with any of various single-edge triggered (SET) FF-based design. For example, FIG. 1A shows features of a circuit 100 to determine the provisioning of a clock signal according to an embodiment. Circuit 100 illustrates one example of an embodiment wherein a clock gate circuit comprises integrated combinatorial logic circuitry to facilitate a frequency division functionality. Such frequency division functionality enables an efficient operation of sequential circuitry which, for example, comprises both single edge triggered flip-flop circuitry, and double edge triggered flip-flop circuitry.

As shown in FIG. 1A, circuit 100 comprises an integrated clock gate (ICG) circuit 150 which is coupled to receive a 1× clock signal 101 which has a first frequency x. ICG circuit 150 is further coupled to receive an enable signal 103 for use in determining whether ICG circuit 150 is to generate, based on 1× clock signal 101, a (½)× clock signal 152 which has a different frequency that (for example) is substantially equal to one-half of the frequency x.

In an embodiment, circuit 100 includes, is coupled to, or otherwise accommodates operation with other circuitry (not shown) which generates or otherwise provides 1× clock signal 101 and enable signal 103—e.g., wherein such generation includes operations adapted (for example) from conventional clock management techniques. The particular techniques for providing 1× clock signal 101 and enable signal 103 are not limiting on some embodiments, and are not detailed herein to avoid obscuring certain features of such embodiments.

In various embodiments, ICG circuit 150 provides the (½)× clock signal 152 to facilitate a power efficient clock architecture that (for example) coordinates operation of both single edge triggered (SET) flip-flop circuitry and double edge triggered (DET) flip-flop circuitry. For example, in the illustrative embodiment shown, circuit 100 further comprises (or alternatively, is to couple to) sequential circuitry 140—such as multi-bit flip-flop circuitry—which is coupled to communicate output data 142 based on the (½)× clock signal 152. In one such embodiment, sequential circuitry 140 comprises DET flip-flops, or other suitable circuitry, which provides output data 142 based on the illustrative input data 132 shown.

In one such embodiment, circuit 100 further comprises another ICG circuit 120 which is similarly coupled to receive both the 1× clock signal 101, and another enable signal 102 for use in determining whether ICG circuit 120 is to generate, based on 1× clock signal 101, another 1× clock signal 126 which has a frequency substantially equal to the frequency x. By way of illustration and not limitation, ICG circuit 120 comprises an AND gate 124 to receive 1× clock signal 101 at one input terminal, wherein, based on enable signal 102, a latch circuit 122 of ICG circuit 120 is to selectively provide 1× clock signal 101 to another input terminal of AND gate 124.

Circuit 100 further comprises (or alternatively, is to couple to) sequential circuitry 110—such as multi-bit flip-flop circuitry—which is coupled to communicate output data 112 based on the 1× clock signal 126. For example, sequential circuitry 110 comprises SET flip-flops, or other suitable circuitry, which provides output data 112 based on the illustrative input data 104 shown. In one such embodiment, input data 132 is generated, by combinatorial circuitry 130 of circuit 100, based on the output data 112 from sequential circuitry 110. In one such embodiment, sequential circuitry 140 is part of, or provides output data 142 to, a circuit domain which is relatively less time constrained (or "non-critical"), as compared to another circuit domain which includes sequential circuitry 110 (or which receives output data 112 from sequential circuitry 110).

Figure 1B:
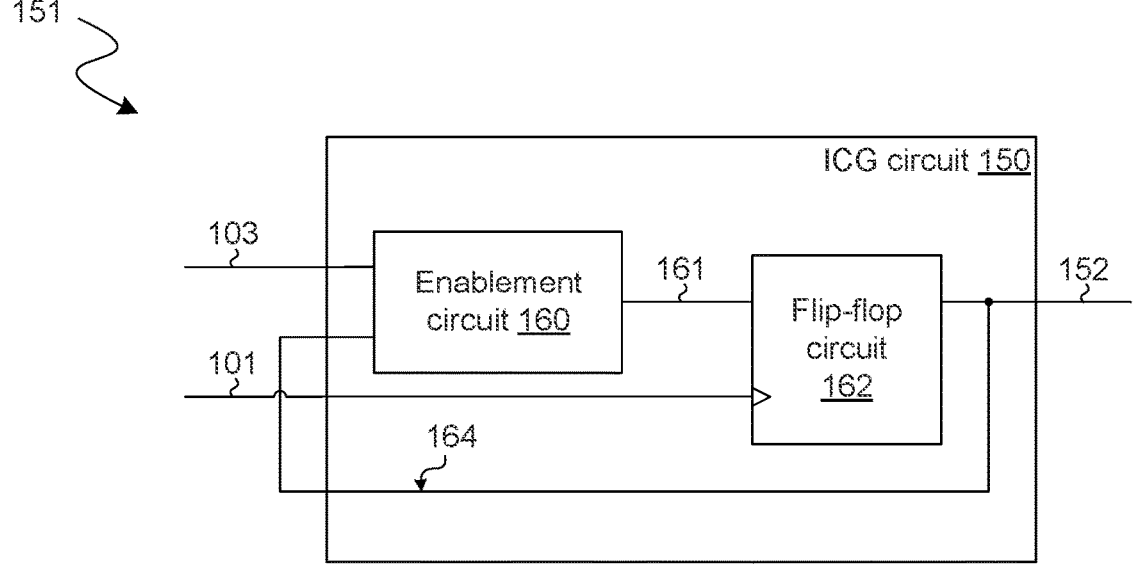
FIG. 1B shows a circuit diagram illustrating features of an integrated clock gate circuit to facilitate a timing of data communications according to an embodiment.

In various embodiments, ICG circuit 150 comprises circuitry to provide both a selective clock gating functionality—e.g., with a modified single edge triggered (SET) flip-flop circuit design—and a frequency division functionality which is based a feedback signal communicated within ICG circuit 150. For example, FIG. 1B shows a detail view 151 of one example implementation of ICG circuit 150 according to an illustrative embodiment.

In the example embodiment illustrated by view 151, ICG circuit 150 comprises first circuitry (such as the illustrative flip-flop circuit 162 shown) which receives the 1× clock signal 101, and second circuitry (such as the illustrative an enablement circuit 160 shown) which receives both a feedback signal 164 from the flip-flop circuit 162, and the enable signal 103. Based on the enable signal 103 and the feedback signal 164, the enablement circuit 160 generates a signal 161 which is to selectively enable (or alternatively, disable) a functionality of the flip-flop circuit 162 for generating the (½)× clock signal 152 based on the 1× clock signal 101.

For example, enablement circuit 160 provides functionality to suspend logic state transitions by (½)× clock signal 152. In one such embodiment, enablement circuit 160 is able to variously suspend (½)× clock signal 152, at different times, in either one of a logic high ("1") state, or a logic low ("0") state.

In some embodiments, enablement circuit 160 comprises combinatorial logic circuitry—e.g., wherein the signal 161 corresponds to (e.g., is equal to or otherwise represents) a result of one or more Boolean operations. In one such embodiment, the one or more Boolean operations includes an exclusive OR (XOR) operation based on the enable signal 103 and the feedback signal 164—e.g., wherein the enablement circuit 160 is an XOR logic gate.

In the example embodiment shown, the feedback signal 164 is the (½)× clock signal 152. In other embodiments, feedback signal 164 is another signal output by flip-flop circuit 162—e.g., wherein one of feedback signal 164 or (½)× clock signal 152 is based on the other of feedback signal 164 or (½)× clock signal 152, or wherein the feedback signal 164 and the (½)× clock signal 152 are each based on the same signal generated by a latch circuit (not shown) of flip-flop circuit 162. Additionally or alternatively, in various embodiments, ICG circuit 150 further comprises a delay circuit (not shown) by which feedback signal 164 is communicated between flip-flop circuit 162 and enablement circuit 160.

Figure 2A:
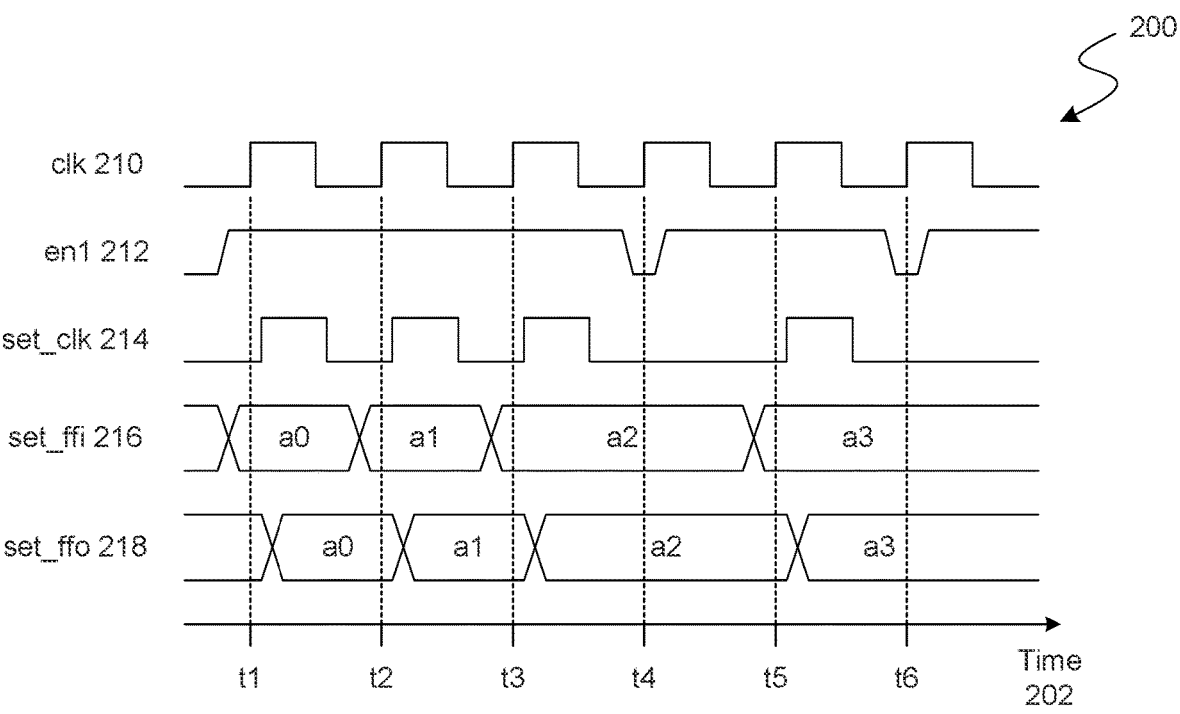
FIGS. 2A, 2B show timing diagrams illustrating respective signals which are communicated based on operations of integrated clock gates according to an embodiment.
Figure 2B:
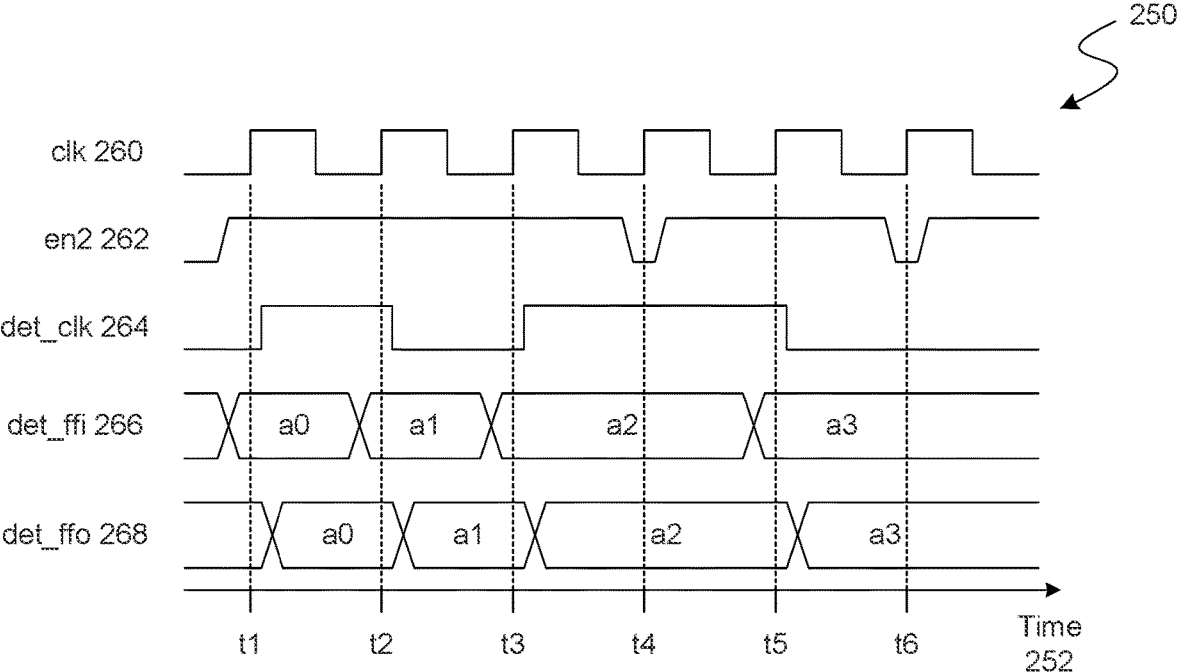

FIGS. 2A, 2B shows timing diagrams 200, 250 illustrating signals which are variously communicated based on operations of respective integrated clock gates according to an embodiment. Time diagrams 200, 250 illustrate features of one embodiment wherein a clock signal is selectively generated with an ICG circuit that provides frequency division functionality.

Timing diagram 200 illustrates first signals which are variously communicated—e.g., with ICG circuit 120 and sequential circuitry 110—over a period of time 202. As shown in FIG. 2A, the first signals include a clock signal clock 210, an enable signal en1 212, a clock signal set_clock 214, input data set_ffi 216, and output data set_ffo 218 which—for example—correspond functionally to 1× clock signal 101, enable signal 102, 1× clock signal 126, input data 104, and output data 112 (respectively).

Furthermore, timing diagram 250 illustrates second signals which are variously communicated—e.g., with ICG circuit 150 and sequential circuitry 140—over a period of time 252. As shown in FIG. 2B, the second signals include a clock signal clock 260, an enable signal en2 262, a clock signal det_clock 264, input data det_ffi 266, and output data det_ffo 268, which for example—correspond functionally to 1× clock signal 101, enable signal 103, (½)× clock signal 152, input data 132, and output data 142 (respectively).

In an illustrative scenario according to one embodiment, enable signal en1 212 remains high during rising edges of clock signal clock 210 at respective times t1, t2, and t3. Based on this high value of enable signal en1 212, clock signal set_clock 214 cycles at a first frequency from just after time t1 until after time t3. Subsequently, enable signal en1 212 is low during a rising edge of clock signal clock 210 at time t4. Consequently, clock signal set_clock 214 is suspended at a low voltage—e.g., corresponding to a logic low ("0") state—during and after time t4. However, enable signal en1 212 is again high during a rising edge of clock signal clock 210 at time t5. Based on this high value of enable signal en1 212, clock signal set_clock 214 resumes cycling at the first frequency just after time t5.

Enable signal en1 212 is again low during a rising edge of clock signal clock 210 at time t6. As a result, clock signal set_clock 214 is again suspended at the low voltage during and after time t6. In one such embodiment, first sequential circuitry (e.g., a first multi-bit FF unit comprising SET FFs) variously receives successive bits a0-a3 of input data set_ffi 216, and latches corresponding bits of output data set_ffo 218, based on the rising edges of clock signal set_clock 214.

In various embodiments, the illustrative scenario further comprises enable signal en2 262 remaining high during rising edges of clock signal clock 260 at respective times t1, t2, and t3. Based on this high value of '262, clock signal det_clock 264 cycles at a second frequency while enable signal en2 262 is high—e.g., wherein the second frequency is equal to substantially half of the first frequency of clock signal set_clock 214. Subsequently, enable signal en2 262 is low during a rising edge of clock signal clock 260 at time t4. As a result, clock signal det_clock 264 is suspended, at a high voltage—e.g., corresponding to a logic high ("1") state—during and after time t4. However, enable signal en2 262 is again high during a rising edge of clock signal clock 260 at time t5. Based on this high value of enable signal en2 262, clock signal det_clock 264 resumes cycling at the second frequency just after time t5—i.e., by transitioning from the high voltage to a low voltage which corresponds to a logic low state.

Enable signal en1 212 is again low during a rising edge of clock signal clock 210 at time t6. As a result, clock signal set_clock 214 is again suspended—e.g., at the low voltage during and after time t6. In one embodiment, second sequential circuitry (e.g., a second multi-bit FF unit comprising DET FFs) variously receives successive bits a0-a3 of input data det_ffi 266, and latches corresponding bits of output data det_ffo 268, based on the rising edges of clock signal det_clock 264. It is to be noted that, in some embodiments, '150 (or other such clock gate circuitry) is able to variously suspend an output clock signal, at different times, in either one of a first logic state or a second logic state which is different than the first logic state.

Figure 3:
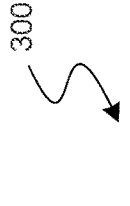
FIG. 3 shows a circuit diagram illustrating features of an integrated clock gate circuit to coordinate a timing of data communication operations according to an embodiment.

FIG. 3 shows features of an integrated clock gate (ICG) circuit 300 to selectively provide a clock signal with frequency division functionality according to an embodiment. ICG circuit 300 illustrates one example of an embodiment wherein a clock gate circuit comprises flip-flop circuitry, and enablement circuitry which is coupled to receive a feedback signal from the flip-flop circuitry, wherein the enablement circuitry is to selectively enable the generation one clock signal based on another, higher-frequency clock signal. In various embodiments, ICG circuit 300 provides functionality such as that of ICG circuit 150—e.g., wherein signals such as those shown in timing diagram 250 are variously communicated based on operation of ICG circuit 300.

As shown in FIG. 3, ICG circuit 300 comprises combinatorial logic 310 which provides functionality such as that of enablement circuit 160. ICG circuit 300 further comprises an arrangement of pass gates, inverters and/or other suitable circuitry which (for example) is to provide functionality such as that of flip-flop circuit 162. By way of illustration and not limitation, a first latch circuit of ICG circuit 300 comprises a pass gate 330, and a pair of inverters 332, 334 which are cross-coupled with each other at an output of pass gate 330. Furthermore, a second latch circuit of ICG circuit 300 comprises a pass gate 340, and circuitry 350 which includes another pair of inverters which are similarly cross-coupled with each other at an output of pass gate 340. Inverters 320, 322 of ICG circuit 300 variously provide signals 321, 323—based on an input clock signal clkin 301 (such as 1× clock signal 101)—to facilitate operation of the first latch circuit and the second latch circuit. In one such embodiment, inverter 334, and a similar inverter of circuitry 350, are tristate-able inverters which are variously powered at different times based on clock signal clkin 301.

Although some embodiments are not limited in this regard, ICG circuit 300 further comprises an inverter 336 which is coupled between the first latch circuit and the second latch circuit. In one such embodiment, inverter 336 facilitates an improved capability of ICG circuit 300 to drive an output clock signal clko 303 which is generated based on clock signal clkin 301, and (for example) is output by an inverter 370 that is coupled to pass gate 340.

In various embodiments, combinatorial logic 310 is coupled to provide a signal 312 which selectively enables (or disables) a functionality of the first latch circuit and the second latch circuit to generate clock signal clko 303 based on clock signal clkin 301. To facilitate both clock gating functionality and frequency division functionality of ICG circuit 300 according to some embodiments, combinatorial logic 310 is coupled to receive both an enable signal 302 (such as enable signal 103) and a feedback signal 382 which—for example—is provided with a delay circuitry 380 of a feedback path from the second latch circuit. In one such embodiment, signal 312 represents a result of one or more Boolean operations which are performed with combinatorial logic 310—e.g., wherein the one or more Boolean operations comprise an exclusive OR (XOR) operation that is based on enable signal 302 and feedback signal 382. For example, combinatorial logic 310 is, or otherwise comprises, a dual pass gate (or other) XOR logic circuit.

Based on such an XOR operation—e.g., in combination with the delay of feedback signal 382 and the successive latch operations of ICG circuit 300—a frequency of clock signal clko 303, when said frequency is enabled by enable signal 302, is less than (for example, substantially equal to one-half of) a frequency of clock signal clkin 301. In some embodiment, ICG circuit 300 is able to variously suspend clock signal clko 303, based on enable signal 302, in either one of a logic low state or a logic high state.

Figure 4:
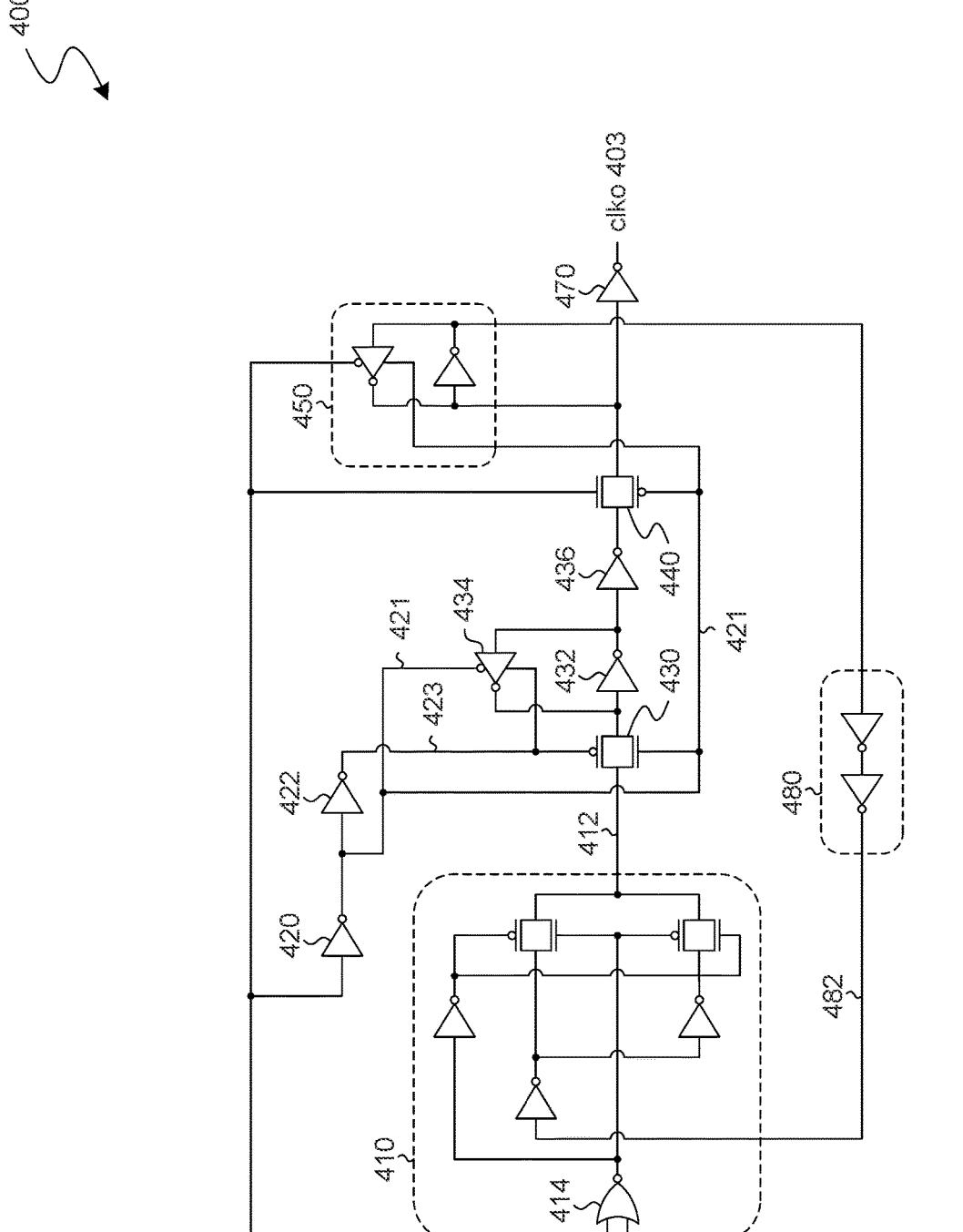
FIG. 4 shows a circuit diagram illustrating features of an integrated clock gate circuit which supports a test mode of operation according to an embodiment.

FIG. 4 shows features of an ICG circuit 400 to provide a clock signal with frequency division functionality according to another embodiment. In various embodiments, ICG circuit 400 provides functionality such as that of ICG circuit 150—e.g., wherein signals in timing diagram 250 are variously communicated based on operations of ICG circuit 400.

In various embodiments, ICG circuit 400 provides functionality similar to that of ICG circuit 300. For example, in one such embodiment, ICG circuit 400 is to variously communicate signals 401, 402, 403, 412, 421, 423, 482 which correspond functionally to signals 301, 302, 303, 312, 321, 323, 382 (respectively). Furthermore, combinatorial logic 410 of ICG circuit 400 corresponds functionally to combinatorial logic 310—e.g., wherein inverters 420, 422, 432, 434, 436, 470 of ICG circuit 400 provide functionality similar to that of inverters 320, 322, 332, 334, 336, 370 (respectively). Further still, pass gates 430, 440 of ICG circuit 400 provide functionality similar to that of pass gates 330, 340—e.g., wherein circuitry 450, and delay circuitry 480 of ICG circuit 400 correspond functionally to circuitry 350, and delay circuitry 380 (respectively).

To facilitate both clock gating functionality and frequency division functionality of ICG circuit 400 according to some embodiments, combinatorial logic 410 is coupled to further receive a signal test 404—e.g., in addition to the enable signal 402 and the feedback signal 482. Signal 412 represents a result of Boolean operations which are performed with combinatorial logic 410 based on feedback signal 482, enable signal 402, and 404. In one such embodiment, the Boolean operations comprise both an OR operation based on enable signal 402 and signal test 404, and an XOR operation which is based on feedback signal 482 and a result of the OR operation. By way of illustration and not limitation, combinatorial logic 410 comprises a NOR gate 414 to receive both enable signal 402 and signal test 404—e.g., as contrasted with the single inverter of combinatorial logic 310 which is to receive enable signal 302. Based on such Boolean operations—e.g., in combination with the delay of feedback signal 482 and latch operations of ICG circuit 400—a frequency of clock signal clko 403, when said frequency is enabled by enable signal 402, is less than (for example, substantially equal to one-half of) a frequency of clock signal clkin 401. In some embodiment, ICG circuit 400 is able to variously suspend clock signal clko 403, based on enable signal 402, in either one of a logic low state or a logic high state.

As shown in FIG. 4, NOR gate 414 has two enable signals (enable signal 402 and signal test 404) as inputs. In various embodiments, enable signal 402 is asserted to facilitate a functional mode of circuitry which is coupled to receive clock signal clko 403 from ICG circuit 400—e.g., where such circuitry includes sequential circuitry 110, combinatorial circuitry 130, and sequential circuitry 140. By contrast, signal test 404 is asserted to facilitate a scan or other test mode of such circuitry. In a typical use case, signal test 404 is asserted during a scan shift/capture mode which enables propagation of scan patterns (vectors).

Figure 5:
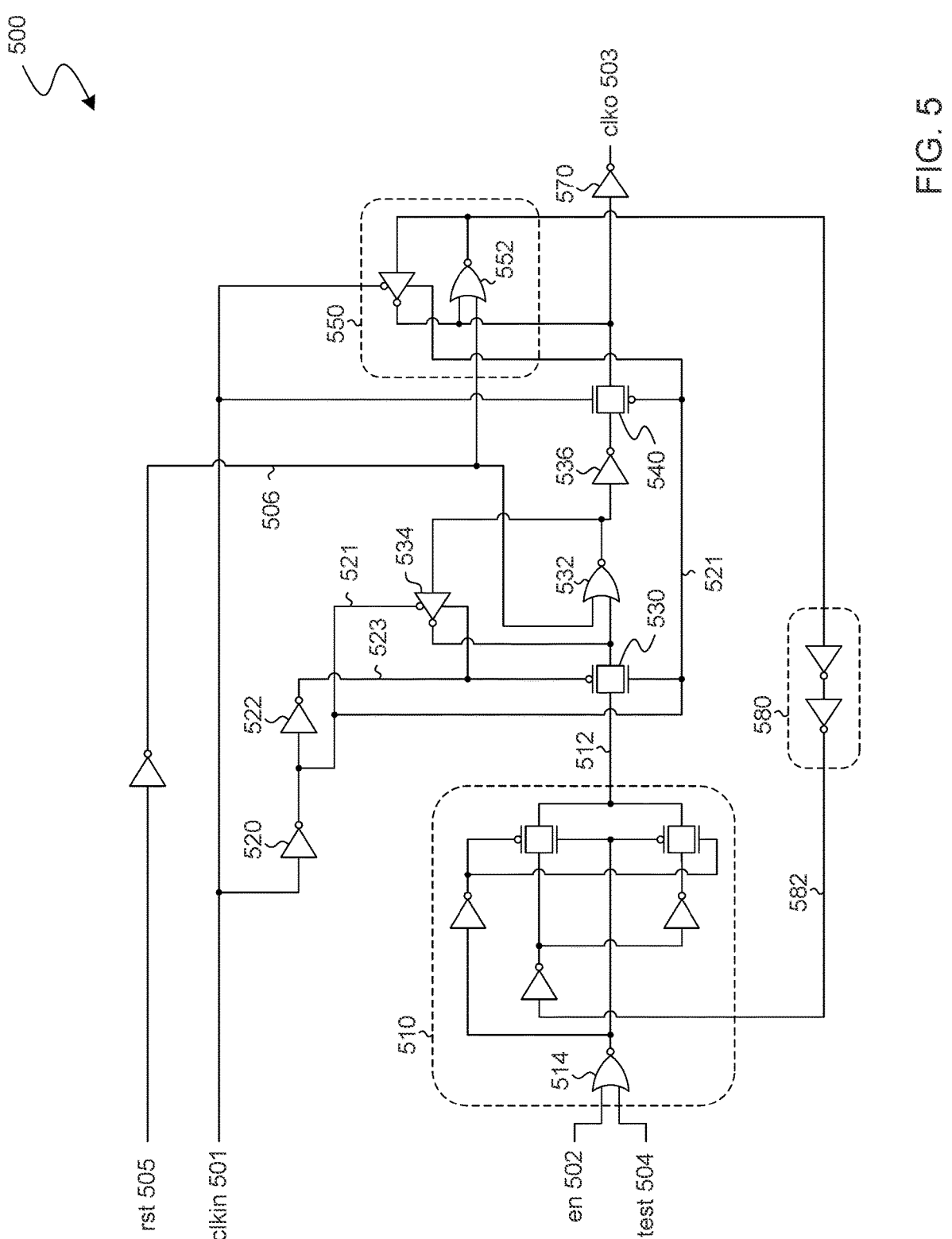
FIG. 5 shows a circuit diagram illustrating features of an integrated clock gate circuit which accommodates being reset to a baseline condition according to an embodiment.

FIG. 5 shows features of an ICG circuit 500 to provide a clock signal with frequency division functionality according to another embodiment. In various embodiments, ICG circuit 500 provides functionality such as that of ICG circuit 150—e.g., wherein signals in timing diagram 250 are variously communicated based on operations of ICG circuit 500.

In various embodiments, ICG circuit 500 provides functionality similar to that of ICG circuit 300 or ICG circuit 400. For example, in one such embodiment, ICG circuit 500 provides functionality similar to that of ICG circuit 400. For example, in one such embodiment, ICG circuit 500 is to communicate signals 501, 502, 503, 504, 512, 521, 523, 582 which correspond functionally to signals 401, 402, 403, 404, 412, 421, 423, 482 (respectively)—e.g., wherein inverters 520, 522, 534, 536, 570 of ICG circuit 500 provide functionality similar to that of inverters 420, 422, 434, 436, 470 (respectively). Furthermore, combinatorial logic 510 of ICG circuit 500 corresponds functionally to combinatorial logic 410—e.g., wherein a NOR gate 514 provides functionality such as that of NOR gate 414. Further still, pass gates 530, 540 of ICG circuit 500 provide functionality similar to that of pass gates 430, 440—e.g., wherein circuitry 550, and delay circuitry 580 of ICG circuit 500 correspond functionally to circuitry 450, and delay circuitry 480.

In the example embodiment shown, a first latch circuit of ICG circuit 500 comprises pass gate 530, the tristate-able inverter 534, and a NOR gate 532 which is cross-coupled with tristate-able inverter 534 at an output of pass gate 530. Furthermore, a second latch circuit of ICG circuit 500 similarly comprises pass gate 540, and circuitry 550 which includes another tristate-able inverter, and a NOR gate 552 which is cross-coupled with the other tristate-able inverter at an output of pass gate 540. In one such embodiment, NOR gates 532, 552 are each coupled to receive a reset signal rst 506 which is to reset ICG circuit 500 to a state that, for example, results in clock signal clko 503 being at some predetermined baseline voltage level (e.g., a logic low state). In supporting such functionality based on reset signal rst 506, some embodiments variously allow circuitry to recover from a fault condition which is based on one or more clock signals each being suspended each in a respective incorrect voltage level.

Figure 6:
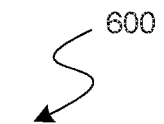
FIG. 6 shows a hybrid block/circuit diagram illustrating features of an IC die to variously provide different clock signals each with a respective integrated clock gate circuit according to an embodiment.

FIG. 6 shows features of an IC die 600 to operate sequential circuitry with clock signals having various respective frequencies according to an embodiment. IC die 600 illustrates one example of an embodiment wherein clock signals are generated with a hierarchy of integrated clock gate (ICG) circuits, wherein the hierarchy comprises multiple ICG circuits that each have integrated circuitry to provide a frequency divider functionality. In various embodiments, IC die 600 provides functionality such as that of circuit 100, ICG circuit 300, ICG circuit 400, or ICG circuit 500—e.g., wherein signals such as those variously shown in timing diagrams 200, 250 are communicated with IC die 600.

As shown in FIG. 6, IC die 600 comprises a hierarchy of ICG circuits, wherein one level of the hierarchy comprises an ICG circuit 610, and a next lower level of the hierarchy comprises ICG circuits 620, 630, 650. ICG circuit 610 is coupled to receive bother a 1× clock signal 602 and an enable signal 604, and is operable—based on enable signal 604—to selectively provide a 1× clock signal 616 that has a frequency which is substantially equal to a frequency x of 1× clock signal 602. In the illustrative embodiment shown, ICG circuit 610 comprises latch circuitry 612 and an AND gate 614 that, for example, correspond functionally to latch circuit 122 and AND gate 124.

In the example embodiment shown, ICG circuit 610 is coupled to provide the 1× clock signal 616 to each of ICG circuits 620, 630, 640, 650. In one such embodiment, ICG circuits 620 and 640 each provide functionally such as that of ICG circuit 120. For example, ICG circuit 620 is coupled to further receive an enable signal 622 which selectively enables ICG circuit 620 to provide a 1× clock signal 624 which is based on the 1× clock signal 616, and which has a frequency substantially equal to the frequency of the 1× clock signal 616. The 1× clock signal 624 is provided by ICG circuit 620 to sequential circuitry 626 which, for example, is a multi-bit flip-flop unit comprising multiple SET flip-flops.

Similarly, ICG circuit 640 is coupled to further receive an enable signal 642 which selectively enables ICG circuit 640 to provide a 1× clock signal 644 which is based on the 1× clock signal 616, and which has a frequency substantially equal to the frequency of the 1× clock signal 616. The 1× clock signal 644 is provided by ICG circuit 640 to sequential circuitry 646 which, for example, is another multi-bit flip-flop unit comprising multiple SET flip-flops.

Additionally or alternatively, ICG circuits 630, 650 each provide functionally such as that of ICG circuit 150, in some embodiments. For example, ICG circuit 630 is coupled to further receive an enable signal 632 which selectively enables ICG circuit 630 to provide a (½)× clock signal 634 which is based on the 1× clock signal 616, and which has a frequency substantially equal to one half of the frequency of the 1× clock signal 616. The (½)× clock signal 634 is provided by ICG circuit 630 to sequential circuitry 636 which, for example, is a multi-bit flip-flop unit comprising multiple DET flip-flops.

Similarly, ICG circuit 650 is coupled to further receive an enable signal 652 which selectively enables ICG circuit 650 to provide a (½)× clock signal 654 which is based on the 1× clock signal 616, and which has a frequency substantially equal to one half of the frequency of the 1× clock signal 616. The (½)× clock signal 654 is provided by ICG circuit 650 to sequential circuitry 656 which, for example, is another multi-bit flip-flop unit comprising multiple DET flip-flops.

Figure 7:
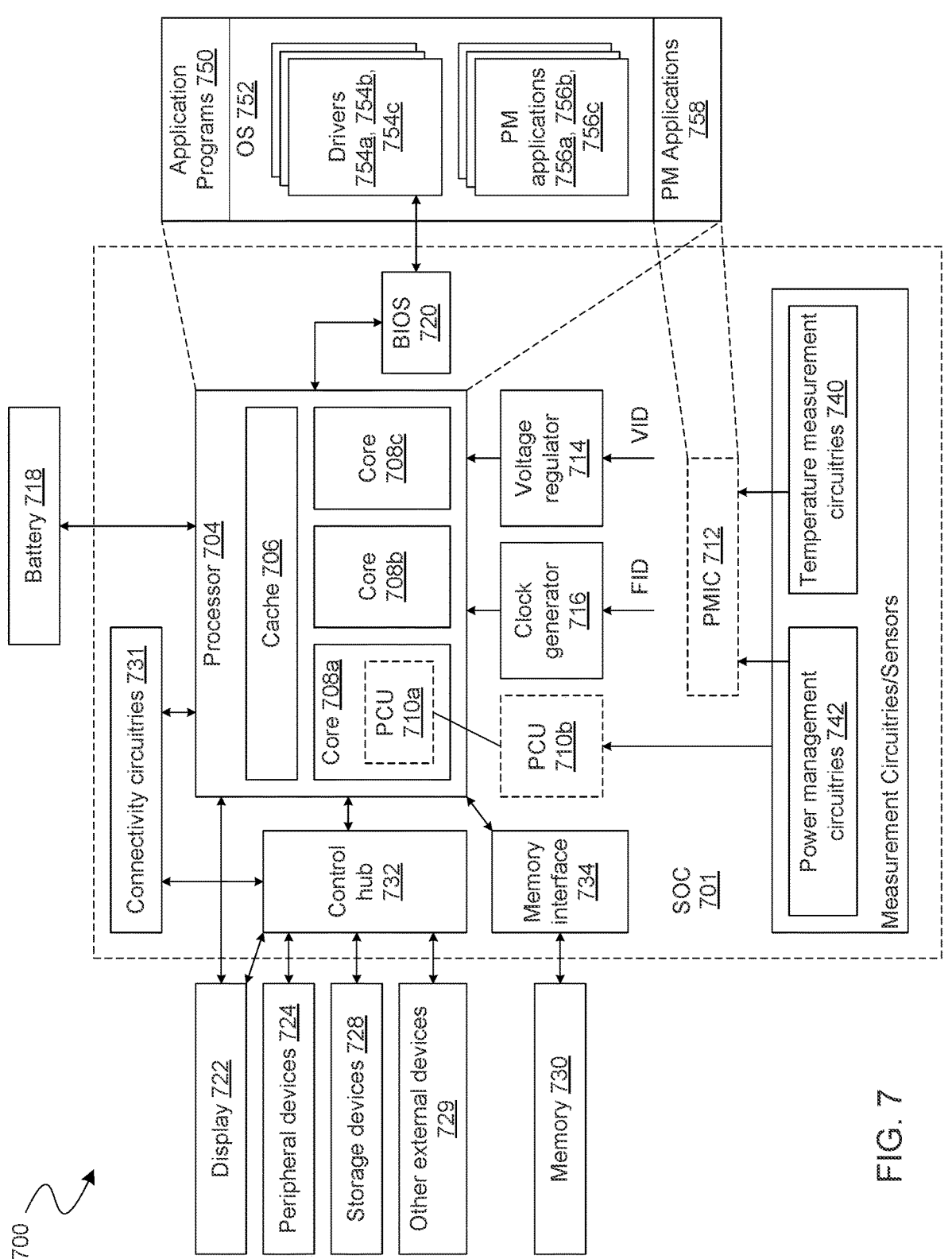
FIG. 7 shows a functional block diagram illustrating features of a computer device to perform frequency division with an integrated clock gate circuit according to an embodiment.

FIG. 7 illustrates a computer system or computing device 700 (also referred to as device 700), wherein an integrated clock gate circuit provides frequency division functionality, in accordance with some embodiments. It is pointed out that those elements of FIG. 7 having the same reference numbers (or names) as the elements of any other figure can operate or function in any manner similar to that described, but are not limited to such.

In some embodiments, device 700 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 700.

In an example, the device 700 comprises a SoC (System-on-Chip) 701. An example boundary of the SOC 701 is illustrated using dotted lines in FIG. 7, with some example components being illustrated to be included within SOC 701—however, SOC 701 may include any appropriate components of device 700.

In some embodiments, device 700 includes processor 704. Processor 704 can include one or more physical devices, such as microprocessors, application processors, microcontrollers, programmable logic devices, processing cores, or other processing means. The processing operations performed by processor 704 include the execution of an operating platform or operating system on which applications and/or device functions are executed. The processing operations include operations related to I/O (input/output) with a human user or with other devices, operations related to power management, operations related to connecting computing device 700 to another device, and/or the like. The processing operations may also include operations related to audio I/O and/or display I/O.

In some embodiments, processor 704 includes multiple processing cores (also referred to as cores) 708a, 708b, 708c. Although merely three cores 708a, 708b, 708c are illustrated in FIG. 7, the processor 704 may include any other appropriate number of processing cores, e.g., tens, or even hundreds of processing cores. Processor cores 708a, 708b, 708c may be implemented on a single integrated circuit (IC) chip. Moreover, the chip may include one or more shared and/or private caches, buses or interconnections, graphics and/or memory controllers, or other components.

In some embodiments, processor 704 includes cache 706. In an example, sections of cache 706 may be dedicated to individual cores 708 (e.g., a first section of cache 706 dedicated to core 708a, a second section of cache 706 dedicated to core 708b, and so on). In an example, one or more sections of cache 706 may be shared among two or more of cores 708. Cache 706 may be split in different levels, e.g., level 1 (L1) cache, level 2 (L2) cache, level 3 (L3) cache, etc.

In some embodiments, a given processor core (e.g., core 708a) may include a fetch unit to fetch instructions (including instructions with conditional branches) for execution by the core 708a. The instructions may be fetched from any storage devices such as the memory 730. Processor core 708a may also include a decode unit to decode the fetched instruction. For example, the decode unit may decode the fetched instruction into a plurality of micro-operations. Processor core 708a may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor core 708a (for example) may be an out-of-order processor core in one embodiment. Processor core 708a may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 708a may also include a bus unit to enable communication between components of the processor core 708a and other components via one or more buses. Processor core 708a may also include one or more registers to store data accessed by various components of the core 708a (such as values related to assigned app priorities and/or sub-system states (modes) association.

In some embodiments, device 700 comprises connectivity circuitries 731. For example, connectivity circuitries 731 includes hardware devices (e.g., wireless and/or wired connectors and communication hardware) and/or software components (e.g., drivers, protocol stacks), e.g., to enable device 700 to communicate with external devices. Device 700 may be separate from the external devices, such as other computing devices, wireless access points or base stations, etc.

In an example, connectivity circuitries 731 may include multiple different types of connectivity. To generalize, the connectivity circuitries 731 may include cellular connectivity circuitries, wireless connectivity circuitries, etc. Cellular connectivity circuitries of connectivity circuitries 731 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 731 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 731 may include a network interface, such as a wired or wireless interface, e.g., so that a system embodiment may be incorporated into a wireless device, for example, cell phone or personal digital assistant.

In some embodiments, device 700 comprises control hub 732, which represents hardware devices and/or software components related to interaction with one or more I/O devices. For example, processor 704 may communicate with one or more of display 722, one or more peripheral devices 724, storage devices 728, one or more other external devices 729, etc., via control hub 732. Control hub 732 may be a chipset, a Platform Control Hub (PCH), and/or the like.

For example, control hub 732 illustrates one or more connection points for additional devices that connect to device 700, e.g., through which a user might interact with the system. For example, devices (e.g., devices 729) that can be attached to device 700 include microphone devices, speaker or stereo systems, audio devices, video systems or other display devices, keyboard or keypad devices, or other I/O devices for use with specific applications such as card readers or other devices.

As mentioned above, control hub 732 can interact with audio devices, display 722, etc. For example, input through a microphone or other audio device can provide input or commands for one or more applications or functions of device 700. Additionally, audio output can be provided instead of, or in addition to display output. In another example, if display 722 includes a touch screen, display 722 also acts as an input device, which can be at least partially managed by control hub 732. There can also be additional buttons or switches on computing device 700 to provide I/O functions managed by control hub 732. In one embodiment, control hub 732 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In some embodiments, control hub 732 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 722 represents hardware (e.g., display devices) and software (e.g., drivers) components that provide a visual and/or tactile display for a user to interact with device 700. Display 722 may include a display interface, a display screen, and/or hardware device used to provide a display to a user. In some embodiments, display 722 includes a touch screen (or touch pad) device that provides both output and input to a user. In an example, display 722 may communicate directly with the processor 704. Display 722 can be one or more of an internal display device, as in a mobile electronic device or a laptop device or an external display device attached via a display interface (e.g., DisplayPort, etc.). In one embodiment display 722 can be a head mounted display (HMD) such as a stereoscopic display device for use in virtual reality (VR) applications or augmented reality (AR) applications.

In some embodiments and although not illustrated in the figure, in addition to (or instead of) processor 704, device 700 may include Graphics Processing Unit (GPU) comprising one or more graphics processing cores, which may control one or more aspects of displaying contents on display 722.

Control hub 732 (or platform controller hub) may include hardware interfaces and connectors, as well as software components (e.g., drivers, protocol stacks) to make peripheral connections, e.g., to peripheral devices 724.

It will be understood that device 700 could both be a peripheral device to other computing devices, as well as have peripheral devices connected to it. Device 700 may have a "docking" connector to connect to other computing devices for purposes such as managing (e.g., downloading and/or uploading, changing, synchronizing) content on device 700. Additionally, a docking connector can allow device 700 to connect to certain peripherals that allow computing device 700 to control content output, for example, to audiovisual or other systems.

In addition to a proprietary docking connector or other proprietary connection hardware, device 700 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 731 may be coupled to control hub 732, e.g., in addition to, or instead of, being coupled directly to the processor 704. In some embodiments, display 722 may be coupled to control hub 732, e.g., in addition to, or instead of, being coupled directly to processor 704.

In some embodiments, device 700 comprises memory 730 coupled to processor 704 via memory interface 734. Memory 730 includes memory devices for storing information in device 700. Memory can include nonvolatile (state does not change if power to the memory device is interrupted) and/or volatile (state is indeterminate if power to the memory device is interrupted) memory devices. Memory device 730 can be a dynamic random access memory (DRAM) device, a static random access memory (SRAM) device, flash memory device, phase-change memory device, or some other memory device having suitable performance to serve as process memory. In one embodiment, memory 730 can operate as system memory for device 700, to store data and instructions for use when the one or more processors 704 executes an application or process. Memory 730 can store application data, user data, music, photos, documents, or other data, as well as system data (whether long-term or temporary) related to the execution of the applications and functions of device 700.

Elements of various embodiments and examples are also provided as a machine-readable medium (e.g., memory 730) for storing the computer-executable instructions (e.g., instructions to implement any other processes discussed herein). The machine-readable medium (e.g., memory 730) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 700 comprises temperature measurement circuitries 740, e.g., for measuring temperature of various components of device 700. In an example, temperature measurement circuitries 740 may be embedded, or coupled or attached to various components, whose temperature are to be measured and monitored. For example, temperature measurement circuitries 740 may measure temperature of (or within) one or more of cores 708*a*, 708*b*, 708*c*, voltage regulator 714, memory 730, a mother-board of SOC 701, and/or any appropriate component of device 700.

In some embodiments, device 700 comprises power measurement circuitries 742, e.g., for measuring power consumed by one or more components of the device 700. In an example, in addition to, or instead of, measuring power, the power measurement circuitries 742 may measure voltage and/or current. In an example, the power measurement circuitries 742 may be embedded, or coupled or attached to various components, whose power, voltage, and/or current consumption are to be measured and monitored. For example, power measurement circuitries 742 may measure power, current and/or voltage supplied by one or more voltage regulators 714, power supplied to SOC 701, power supplied to device 700, power consumed by processor 704 (or any other component) of device 700, etc.

In some embodiments, device 700 comprises one or more voltage regulator circuitries, generally referred to as voltage regulator (VR) 714. VR 714 generates signals at appropriate voltage levels, which may be supplied to operate any appropriate components of the device 700. Merely as an example, VR 714 is illustrated to be supplying signals to processor 704 of device 700. In some embodiments, VR 714 receives one or more Voltage Identification (VID) signals, and generates the voltage signal at an appropriate level, based on the VID signals. Various type of VRs may be utilized for the VR 714. For example, VR 714 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 710*a/b* and/or PMIC 712. In some embodiments, each core has a network of distributed LDOs to provide efficient control for power management. The LDOs can be digital, analog, or a combination of digital or analog LDOs.

In some embodiments, device 700 comprises one or more clock generator circuitries, generally referred to as clock generator 716. Clock generator 716 generates clock signals at appropriate frequency levels, which may be supplied to any appropriate components of device 700. Merely as an example, clock generator 716 is illustrated to be supplying clock signals to processor 704 of device 700. In some embodiments, clock generator 716 receives one or more Frequency Identification (FID) signals, and generates the clock signals at an appropriate frequency, based on the FID signals.

In some embodiments, device 700 comprises battery 718 supplying power to various components of device 700. Merely as an example, battery 718 is illustrated to be supplying power to processor 704. Although not illustrated in the figures, device 700 may comprise a charging circuitry, e.g., to recharge the battery, based on Alternating Current (AC) power supply received from an AC adapter.

In some embodiments, device 700 comprises Power Control Unit (PCU) 710 (also referred to as Power Management Unit (PMU), Power Controller, etc.). In an example, some sections of PCU 710 may be implemented by one or more processing cores 708, and these sections of PCU 710 are symbolically illustrated using a dotted box and labelled PCU 710*a*. In an example, some other sections of PCU 710 may be implemented outside the processing cores 708, and these sections of PCU 710 are symbolically illustrated using a dotted box and labelled as PCU 710*b*. PCU 710 may implement various power management operations for device 700. PCU 710 may include hardware interfaces, hardware circuitries, connectors, registers, etc., as well as software components (e.g., drivers, protocol stacks), to implement various power management operations for device 700.

In some embodiments, device 700 comprises Power Management Integrated Circuit (PMIC) 712, e.g., to implement various power management operations for device 700. In some embodiments, PMIC 712 is a Reconfigurable Power Management ICs (RPMICs) and/or an IMVP (Intel® Mobile Voltage Positioning). In an example, the PMIC is within an IC chip separate from processor 704. The may implement various power management operations for device 700. PMIC 712 may include hardware interfaces, hardware circuitries, connectors, registers, etc., as well as software components (e.g., drivers, protocol stacks), to implement various power management operations for device 700.

In an example, device 700 comprises one or both PCU 710 or PMIC 712. In an example, any one of PCU 710 or PMIC 712 may be absent in device 700, and hence, these components are illustrated using dotted lines.

Various power management operations of device 700 may be performed by PCU 710, by PMIC 712, or by a combination of PCU 710 and PMIC 712. For example, PCU 710 and/or PMIC 712 may select a power state (e.g., P-state) for various components of device 700. For example, PCU 710 and/or PMIC 712 may select a power state (e.g., in accordance with the ACPI (Advanced Configuration and Power Interface) specification) for various components of device 700. Merely as an example, PCU 710 and/or PMIC 712 may cause various components of the device 700 to transition to a sleep state, to an active state, to an appropriate C state (e.g., C0 state, or another appropriate C state, in accordance with the ACPI specification), etc. In an example, PCU 710 and/or PMIC 712 may control a voltage output by VR 714 and/or a frequency of a clock signal output by the clock generator, e.g., by outputting the VID signal and/or the FID signal, respectively. In an example, PCU 710 and/or PMIC 712 may control battery power usage, charging of battery 718, and features related to power saving operation.

The clock generator 716 can comprise a phase locked loop (PLL), frequency locked loop (FLL), or any suitable clock source. In some embodiments, each core of processor 704 has its own clock source. As such, each core can operate at a frequency independent of the frequency of operation of the other core. In some embodiments, PCU 710 and/or PMIC 712 performs adaptive or dynamic frequency scaling or adjustment. For example, clock frequency of a processor core can be increased if the core is not operating at its maximum power consumption threshold or limit. In some embodiments, PCU 710 and/or PMIC 712 determines the operating condition of each core of a processor, and opportunistically adjusts frequency and/or power supply voltage of that core without the core clocking source (e.g., PLL of that core) losing lock when the PCU 710 and/or PMIC 712 determines that the core is operating below a target performance level. For example, if a core is drawing current from a power supply rail less than a total current allocated for that core or processor 704, then PCU 710 and/or PMIC 712 can temporarily increase the power draw for that core or processor 704 (e.g., by increasing clock frequency and/or power supply voltage level) so that the core or processor 704 can perform at a higher performance level. As such, voltage and/or frequency can be increased temporality for processor 704 without violating product reliability.

In an example, PCU 710 and/or PMIC 712 may perform power management operations, e.g., based at least in part on receiving measurements from power measurement circuitries 742, temperature measurement circuitries 740, charge level of battery 718, and/or any other appropriate information that may be used for power management. To that end, PMIC 712 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 710 and/or PMIC 712 in at least one embodiment to allow PCU 710 and/or PMIC 712 to manage processor core energy at least in part based on value(s) detected by one or more of the sensors.

Also illustrated is an example software stack of device 700 (although not all elements of the software stack are illustrated). Merely as an example, processors 704 may execute application programs 750, Operating System 752, one or more Power Management (PM) specific application programs (e.g., generically referred to as PM applications 758), and/or the like. PM applications 758 may also be executed by the PCU 710 and/or PMIC 712. OS 752 may also include one or more PM applications 756*a*, 756*b*, 756*c*. The OS 752 may also include various drivers 754*a*, 754*b*, 754*c*, etc., some of which may be specific for power management purposes. In some embodiments, device 700 may further comprise a Basic Input/Output System (BIOS) 720. BIOS 720 may communicate with OS 752 (e.g., via one or more drivers 754), communicate with processors 704, etc.

For example, one or more of PM applications 758, 756, drivers 754, BIOS 720, etc. may be used to implement power management specific tasks, e.g., to control voltage and/or frequency of various components of device 700, to control wake-up state, sleep state, and/or any other appropriate power state of various components of device 700, control battery power usage, charging of the battery 718, features related to power saving operation, etc.

In various embodiments, clock generator 716 (or other circuitry of SOC 701 which is coupled to operate with clock generator 716) comprises clock gate circuitry which facilitates a frequency division functionality as described herein—for example, wherein the clock gate circuitry has integrated combinatorial logic such as comprising an XOR gate.

In this description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In one or more first embodiments, an integrated circuit (IC) die comprises a first clock gate circuit comprising a first flip-flop circuit to receive the first clock signal, and a first enablement circuit coupled to receive both a first feedback signal from the first flip-flop circuit and a first control signal, the first enablement circuit to generate, based on the first control signal and the first feedback signal, a first output to selectively enable the first flip-flop circuit to generate a second clock signal based on the first clock signal, wherein the first output corresponds to a result of a first one or more Boolean operations comprising a first exclusive OR (XOR)

operation based on the first control signal and the first feedback signal, and wherein a first frequency of the first clock signal is substantially equal to twice a second frequency of the second clock signal.

In one or more second embodiments, further to the first embodiment, the IC die further comprises a first multi-bit flip-flop unit coupled to communicate first data based on the second clock signal, wherein the first multi-bit flip-flop circuit comprises double edge triggered flip-flops.

In one or more third embodiments, further to the second embodiment, the IC die further comprises a second clock gate circuit to receive a second control signal, and the first clock signal, generate a third clock signal based on both the first clock signal and the second control signal, wherein a third frequency of the third clock signal is substantially equal to the first frequency, a second multi-bit flip-flop unit coupled to communicate second data based on the second clock signal, wherein the second multi-bit flip-flop circuit comprises single edge triggered flip-flops.

In one or more fourth embodiments, further to the first embodiment or the second embodiment, the first enablement circuit is further to receive the first test enable signal, the first enablement circuit is to generate the first output further based on the first test enable signal, and the first one or more Boolean operations further comprises a first OR operation based on the first control signal and the first test enable signal.

In one or more fifth embodiments, further to any of the first, second or fourth embodiments, the first enablement circuit is a first XOR gate.

In one or more sixth embodiments, further to any of the first, second or fourth embodiments, the first flip-flop circuit comprises a first latch circuit comprising a first pass gate, and a first pair of inverters which are cross-coupled with each other and coupled to the first pass gate, a second latch circuit comprising a second pass gate, and a second pair of inverters cross-coupled with each other and coupled to the second pass gate, and an inverter coupled between the first latch circuit and the second latch circuit.

In one or more seventh embodiments, further to any of the first, second or fourth embodiments, the first clock gate circuit further comprises a first delay circuit coupled between the first flip-clop circuit and the first enablement circuit, the first delay circuit to communicate the first feedback circuit.

In one or more eighth embodiments, further to any of the first, second or fourth embodiments, the first flip-flop circuit comprises a first latch circuit comprising a first pass gate, a first inverter, and a first NOR gate which is cross-coupled with the first inverter and coupled to the first pass gate, and a second latch circuit comprising a second pass gate, a second inverter, and a second NOR gate which is cross-coupled with the second inverter and coupled to the second pass gate, wherein the first NOR gate and the second NOR gate are each coupled to further receive a second control signal to reset the first clock gate circuit.

In one or more ninth embodiments, further to the eighth embodiment, the first enablement circuit is further to receive the first test enable signal, the first enablement circuit is to generate the first output further based on the first test enable signal, and the first one or more Boolean operations further comprises a first OR operation based on the first control signal and the first test enable signal.

In one or more tenth embodiments, further to any of the first, second or fourth embodiments, based on the first control signal the first flip-flop circuit is to suspend the second clock signal in a first logic state at a first time, and the first flip-flop circuit is to further suspend the second clock signal in a second logic state at a second time, wherein the first logic state is different than the second logic state.

In one or more eleventh embodiments, an integrated circuit (IC) die comprises a first clock gate circuit comprising a first flip-flop circuit to receive the first clock signal, and a first enablement circuit coupled to receive both a first feedback signal from the first flip-flop circuit and a first control signal, the first enablement circuit to generate, based on the first control signal and the first feedback signal, a first output to selectively enable the first flip-flop circuit to generate a second clock signal based on the first clock signal, wherein, based on the first feedback signal, a first frequency of the first clock signal is substantially equal to twice a second frequency of the second clock signal, a first multi-bit flip-flop unit coupled to communicate first data based on the second clock signal, wherein the first multi-bit flip-flop circuit comprises double edge triggered flip-flops.

In one or more twelfth embodiments, further to the eleventh embodiment, the IC die further comprises a second clock gate circuit to receive a second control signal, and the first clock signal, generate a third clock signal based on both the first clock signal and the second control signal, wherein a third frequency of the third clock signal is substantially equal to the first frequency, a second multi-bit flip-flop unit coupled to communicate first data based on the second clock signal, wherein the second multi-bit flip-flop circuit comprises single edge triggered flip-flops.

In one or more thirteenth embodiments, further to the eleventh embodiment or the twelfth embodiment, the first output is to represent a result of a first one or more Boolean operations comprising a first exclusive OR (XOR) operation based on the first control signal and the first feedback signal.

In one or more fourteenth embodiments, further to any of the eleventh through thirteenth embodiments, the first enablement circuit is further to receive the first test enable signal, the first enablement circuit is to generate the first output further based on the first test enable signal, and the first one or more Boolean operations further comprises a first OR operation based on the first control signal and the first test enable signal.

In one or more fifteenth embodiments, further to any of the eleventh through fourteenth embodiments, the first enablement circuit is a first XOR gate.

In one or more sixteenth embodiments, further to any of the eleventh through fourteenth embodiments, the first flip-flop circuit comprises a first latch circuit comprising a first pass gate, and a first pair of inverters which are cross-coupled with each other and coupled to the first pass gate, a second latch circuit comprising a second pass gate, and a second pair of inverters cross-coupled with each other and coupled to the second pass gate, and an inverter coupled between the first latch circuit and the second latch circuit.

In one or more seventeenth embodiments, further to any of the eleventh through fourteenth embodiments, the first clock gate circuit further comprises a first delay circuit coupled between the first flip-clop circuit and the first enablement circuit, the first delay circuit to communicate the first feedback circuit.

In one or more eighteenth embodiments, further to any of the eleventh through fourteenth embodiments, the first flip-flop circuit comprises a first latch circuit comprising a first pass gate, a first inverter, and a first NOR gate which is cross-coupled with the first inverter and coupled to the first pass gate, and a second latch circuit comprising a second pass gate, a second inverter, and a second NOR gate which is cross-coupled with the second inverter and coupled to the second pass gate, wherein the first NOR gate and the second NOR gate are each coupled to further receive a second control signal to reset the first clock gate circuit.

In one or more nineteenth embodiments, further to the eighteenth embodiment, the first enablement circuit is further to receive the first test enable signal, the first enablement circuit is to generate the first output further based on the first test enable signal, and the first one or more Boolean operations further comprises a first OR operation based on the first control signal and the first test enable signal.

In one or more twentieth embodiments, a system comprises a memory, a processor coupled to the memory, the processor comprising a first clock gate circuit comprising a first flip-flop circuit to receive the first clock signal, and a first enablement circuit coupled to receive both a first feedback signal from the first flip-flop circuit and a first control signal, the first enablement circuit to generate, based on the first control signal and the first feedback signal, a first output to selectively enable the first flip-flop circuit to generate a second clock signal based on the first clock signal, wherein the first output corresponds to a result of a first one or more Boolean operations comprising a first exclusive OR (XOR) operation based on the first control signal and the first feedback signal, and wherein a first frequency of the first clock signal is substantially equal to twice a second frequency of the second clock signal, and a wireless interface to enable the processor to communicate with another device.

In one or more twenty-first embodiments, further to the twentieth embodiment, the processor further comprises a first multi-bit flip-flop unit coupled to communicate first data based on the second clock signal, wherein the first multi-bit flip-flop circuit comprises double edge triggered flip-flops.

In one or more twenty-second embodiments, further to the twenty-first embodiment, the processor further comprises a second clock gate circuit to receive a second control signal, and the first clock signal, generate a third clock signal based on both the first clock signal and the second control signal, wherein a third frequency of the third clock signal is substantially equal to the first frequency, a second multi-bit flip-flop unit coupled to communicate first data based on the second clock signal, wherein the second multi-bit flip-flop circuit comprises single edge triggered flip-flops.

In one or more twenty-third embodiments, further to the twentieth embodiment or the twenty-first embodiment, the first enablement circuit is further to receive the first test enable signal, the first enablement circuit is to generate the first output further based on the first test enable signal, and the first one or more Boolean operations further comprises a first OR operation based on the first control signal and the first test enable signal.

In one or more twenty-fourth embodiments, further to any of the twentieth, twenty-first, or twenty-third embodiments, the first enablement circuit is a first XOR gate.

In one or more twenty-fifth embodiments, further to any of the twentieth, twenty-first, or twenty-third embodiments, the first flip-flop circuit comprises a first latch circuit comprising a first pass gate, and a first pair of inverters which are cross-coupled with each other and coupled to the first pass gate, a second latch circuit comprising a second pass gate, and a second pair of inverters cross-coupled with each other and coupled to the second pass gate, and an inverter coupled between the first latch circuit and the second latch circuit.

In one or more twenty-sixth embodiments, further to any of the twentieth, twenty-first, or twenty-third embodiments, the first clock gate circuit further comprises a first delay circuit coupled between the first flip-clop circuit and the first enablement circuit, the first delay circuit to communicate the first feedback circuit.

In one or more twenty-seventh embodiments, further to any of the twentieth, twenty-first, or twenty-third embodiments, the first flip-flop circuit comprises a first latch circuit comprising a first pass gate, a first inverter, and a first NOR gate which is cross-coupled with the first inverter and coupled to the first pass gate, and a second latch circuit comprising a second pass gate, a second inverter, and a second NOR gate which is cross-coupled with the second inverter and coupled to the second pass gate, wherein the first NOR gate and the second NOR gate are each coupled to further receive a second control signal to reset the first clock gate circuit.

In one or more twenty-eighth embodiments, further to the twenty-seventh embodiment, the first enablement circuit is further to receive the first test enable signal, the first enablement circuit is to generate the first output further based on the first test enable signal, and the first one or more Boolean operations further comprises a first OR operation based on the first control signal and the first test enable signal.

In one or more twenty-ninth embodiments, further to any of the twentieth, twenty-first, or twenty-third embodiments, based on the first control signal the first flip-flop circuit is to suspend the second clock signal in a first logic state at a first time, and the first flip-flop circuit is to further suspend the second clock signal in a second logic state at a second time, wherein the first logic state is different than the second logic state.

Techniques and architectures for controlling the provisioning of a clock signal are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) die comprising:
a first clock gate circuit comprising:
a first flip-flop circuit to receive a first clock signal; and
a first enablement circuit coupled to receive both a first feedback signal from the first flip-flop circuit and a first control signal, the first enablement circuit to generate, based on the first control signal and the first feedback signal, a first output to selectively enable the first flip-flop circuit to generate a second clock signal based on the first clock signal;
wherein the first output corresponds to a result of a first one or more Boolean operations comprising a first exclusive OR (XOR) operation based on the first control signal and the first feedback signal, and wherein a first frequency of the first clock signal is substantially equal to twice a second frequency of the second clock signal responsive to the first control signal being at a first logical state, and the first output is suspended at a low or high logical level responsive to the first control signal being at a second logical state that is different than the first logical state.

2. The IC die of claim 1, further comprising:

a first multi-bit flip-flop unit coupled to communicate first data based on the second clock signal, wherein the first multi-bit flip-flop circuit comprises double edge triggered flip-flops.

3. The IC die of claim 2, further comprising:

a second clock gate circuit to:

receive a second control signal, and the first clock signal;

generate a third clock signal based on both the first clock signal and the second control signal, wherein a third frequency of the third clock signal is substantially equal to the first frequency;

a second multi-bit flip-flop unit coupled to communicate second data based on the second clock signal, wherein the second multi-bit flip-flop circuit comprises single edge triggered flip-flops.

4. The IC die of claim 1, wherein:

the first enablement circuit is further to receive a first test enable signal;

the first enablement circuit is to generate the first output further based on the first test enable signal; and the first one or more Boolean operations further comprises a first OR operation based on the first control signal and the first test enable signal.

5. The IC die of claim 1, wherein the first flip-flop circuit comprises:

a first latch circuit comprising a first pass gate, and a first pair of inverters which are cross-coupled with each other and coupled to the first pass gate;

a second latch circuit comprising a second pass gate, and a second pair of inverters cross-coupled with each other and coupled to the second pass gate; and an inverter coupled between the first latch circuit and the second latch circuit.

6. The IC die of claim 1, wherein the first clock gate circuit further comprises a first delay circuit coupled between the first flip-clop circuit and the first enablement circuit, the first delay circuit to communicate the first feedback circuit.

7. The IC die of claim 1, wherein the first flip-flop circuit comprises:

a first latch circuit comprising a first pass gate, a first inverter, and a first NOR gate which is cross-coupled with the first inverter and coupled to the first pass gate; and a second latch circuit comprising a second pass gate, a second inverter, and a second NOR gate which is cross-coupled with the second inverter and coupled to the second pass gate;

wherein the first NOR gate and the second NOR gate are each coupled to further receive a second control signal to reset the first clock gate circuit.

8. The IC die of claim 1, wherein, based on the first control signal:

the first flip-flop circuit is to suspend the second clock signal in a first logic state at a first time; and the first flip-flop circuit is to further suspend the second clock signal in a second logic state at a second time, wherein the first logic state is different than the second logic state.

9. An integrated circuit (IC) die comprising:

a first clock gate circuit comprising:

a first flip-flop circuit to receive the first clock signal; and a first enablement circuit coupled to receive both a first feedback signal from the first flip-flop circuit and a first control signal, the first enablement circuit to generate, based on the first control signal and the first feedback signal, a first output to selectively enable the first flip-flop circuit to generate a second clock signal based on the first clock signal;

wherein, based on the first feedback signal, a first frequency of the first clock signal is substantially equal to twice a second frequency of the second clock signal responsive to the first control signal being at a first logical state, and the first output is suspended at a low or high logical level responsive to the first control signal being at a second logical state that is different than the first logical state;

a first multi-bit flip-flop unit coupled to communicate first data based on the second clock signal, wherein the first multi-bit flip-flop circuit comprises double edge triggered flip-flops.

10. The IC die of claim 9, wherein the first output is to represent a result of a first one or more Boolean operations comprising a first exclusive OR (XOR) operation based on the first control signal and the first feedback signal.

11. The IC die of claim 9, wherein:

the first enablement circuit is further to receive the first test enable signal;

the first enablement circuit is to generate the first output further based on the first test enable signal; and the first one or more Boolean operations further comprises a first OR operation based on the first control signal and the first test enable signal.

12. The IC die of claim 9, wherein the first flip-flop circuit comprises:

a first latch circuit comprising a first pass gate, and a first pair of inverters which are cross-coupled with each other and coupled to the first pass gate;

a second latch circuit comprising a second pass gate, and a second pair of inverters cross-coupled with each other and coupled to the second pass gate; and an inverter coupled between the first latch circuit and the second latch circuit.

13. The IC die of claim 9, wherein the first clock gate circuit further comprises a first delay circuit coupled between the first flip-clop circuit and the first enablement circuit, the first delay circuit to communicate the first feedback circuit.

14. The IC die of claim 9, wherein the first flip-flop circuit comprises:

a first latch circuit comprising a first pass gate, a first inverter, and a first NOR gate which is cross-coupled with the first inverter and coupled to the first pass gate; and a second latch circuit comprising a second pass gate, a second inverter, and a second NOR gate which is cross-coupled with the second inverter and coupled to the second pass gate;

wherein the first NOR gate and the second NOR gate are each coupled to further receive a second control signal to reset the first clock gate circuit.

15. A system comprising:

a memory;

a processor coupled to the memory, the processor comprising:

a first clock gate circuit comprising:

a first flip-flop circuit to receive the first clock signal; and a first enablement circuit coupled to receive both a first feedback signal from the first flip-flop circuit and a first control signal, the first enablement circuit to generate, based on the first control signal and the first feedback signal, a first output to selectively enable the first flip-flop circuit to generate a second clock signal based on the first clock signal;

wherein the first output corresponds to a result of a first one or more Boolean operations comprising a first exclusive OR (XOR) operation based on the first control signal and the first feedback signal, and wherein a first frequency of the first clock signal is substantially equal to twice a second frequency of the second clock signal responsive to the first control signal being at a first logical state, and the first output is suspended at a low or high logical level responsive to the first control signal being at a second logical state that is different than the first logical state; and a wireless interface to enable the processor to communicate with another device.

16. The system of claim 15, the processor further comprising:

a first multi-bit flip-flop unit coupled to communicate first data based on the second clock signal, wherein the first multi-bit flip-flop circuit comprises double edge triggered flip-flops.

17. The system of claim 15, wherein:

the first enablement circuit is further to receive the first test enable signal:

the first enablement circuit is to generate the first output further based on the first test enable signal; and the first one or more Boolean operations further comprises a first OR operation based on the first control signal and the first test enable signal.

18. The system of claim 15, wherein the first flip-flop circuit comprises:

a first latch circuit comprising a first pass gate, and a first pair of inverters which are cross-coupled with each other and coupled to the first pass gate;

a second latch circuit comprising a second pass gate, and a second pair of inverters cross-coupled with each other and coupled to the second pass gate; and an inverter coupled between the first latch circuit and the second latch circuit.

19. The system of claim 15, wherein the first flip-flop circuit comprises:

a first latch circuit comprising a first pass gate, a first inverter, and a first NOR gate which is cross-coupled with the first inverter and coupled to the first pass gate; and a second latch circuit comprising a second pass gate, a second inverter, and a second NOR gate which is cross-coupled with the second inverter and coupled to the second pass gate;

wherein the first NOR gate and the second NOR gate are each coupled to further receive a second control signal to reset the first clock gate circuit.

20. The system of claim 15, wherein, based on the first control signal:

the first flip-flop circuit is to suspend the second clock signal in a first logic state at a first time; and the first flip-flop circuit is to further suspend the second clock signal in a second logic state at a second time, wherein the first logic state is different than the second logic state.

* * * * *